(12) United States Patent
Diot et al.

(10) Patent No.: US 6,885,088 B2
(45) Date of Patent: Apr. 26, 2005

(54) FLAT LEADFRAME FOR A SEMICONDUCTOR PACKAGE

(75) Inventors: Jean-Luc Diot, Grenoble (FR);
Christophe Prior, Le Versoud (FR);
Jérome Teysseyre, Grenoble (FR);
Jean-Pierre Moscicki, Saint Martin le Vinoux (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/371,397

(22) Filed: Feb. 20, 2003

(65) Prior Publication Data

US 2003/0234446 A1 Dec. 25, 2003

(30) Foreign Application Priority Data

Feb. 20, 2002 (FR) .............................................. 02 02171

(51) Int. Cl.⁷ .......................................... H01L 23/495
(52) U.S. Cl. ........................ 257/666; 257/787; 257/676
(58) Field of Search ................................ 257/666, 676, 257/669, 674, 787

(56) References Cited

U.S. PATENT DOCUMENTS 5,639,694 A * 6/1997 Diffenderfer et al. .......... 29/827
6,627,976 B1 * 9/2003 Chung et al. ................ 257/666
6,667,439 B1 * 12/2003 Salatino et al. ............. 174/52.1

FOREIGN PATENT DOCUMENTS

| EP | 1032037 | 8/2000 | ......... H01L/23/495 |
| JP | 61097955 | 5/1986 | ........... H01L/23/48 |
| JP | 62098751 | 10/1987 | ........... H01L/23/08 |
| JP | 63115355 | 5/1988 | ........... H01L/23/50 |
| JP | 63228655 | 9/1988 | ........... H01L/23/50 |
| JP | 2001077273 | 9/1988 | ........... H01L/23/50 |
| JP | 01065861 | 3/1989 | ........... H01L/23/50 |
| JP | 05095077 | 4/1993 | ........... H01L/23/50 |
| JP | 06069401 | 3/1994 | ........... H01L/23/50 |
| JP | 2000003986 | 1/2000 | ........... H01L/23/36 |

* cited by examiner

Primary Examiner—Roy Potter
(74) Attorney, Agent, or Firm—Lisa K. Jorgenson; Allen, Dyer, Doppelt, Milbrath & Gilchrist, P.A.

(57) ABSTRACT

The leadframe has a perforation to form, between a central platform and a peripheral part located a certain distance apart, radiating elongate leads. The leadframe has, on its rear face that comes into contact with a bearing surface of a mold, at least one recess and a groove for connecting this recess to the perforation.

24 Claims, 7 Drawing Sheets

FIG_1

FIG_2

FIG_3

FIG_4

FIG_5

FIG_6

FIG_7

FIG_8

FIG_9

FLAT LEADFRAME FOR A SEMICONDUCTOR PACKAGE

FIELD OF THE INVENTION

The present invention relates to the field of semiconductor packaging.

BACKGROUND OF THE INVENTION

Semiconductor packages typically include a leadframe made of an electrically conductive material. An integrated circuit chip is fixed to a front face of a platform of the leadframe, and peripheral leads are connected to the chip via electrical connection wires. The assembly is encapsulated and external electrical connections are made on a rear face of the leads.

SUMMARY OF THE INVENTION

An object of the present invention is to improve the conditions under which an encapsulation material is injected so as to improve the quality of the final semiconductor packages obtained, especially from the standpoint of their mechanical strength and their sealing.

The subject of the present invention is firstly a flat leadframe made of an electrically conducting material, intended for the production of at least one semiconductor package, which leadframe has a front face and a rear face and through which at least one perforation is provided so as to form, between a central platform and a peripheral part lying a certain distance apart, radiating elongate leads, some of which have outer and inner ends connected to the peripheral part and to the platform, respectively, and others of which have outer ends connected to the peripheral part and inner ends lying at a certain distance from the platform.

The leadframe is more particularly intended to be held between two parts of a mold, for the injection moulding of an encapsulation material, which delimit between them at least one cavity, in a position such that its aforementioned rear face is in contact with a bearing surface of part of this mold. According to the invention, the platform preferably has, on its rear face that comes into contact with the bearing face of the mold, at least one recess formed at a certain distance from its periphery. According to the invention, the platform preferably has, on its rear face, at least one connecting groove, the ends of which emerge, on one side, in the recess and, on the other side, in the perforation.

According to the invention, the platform may have, on its rear face, at least one hollow opening into the perforation, the connecting groove emerging in this hollow. According to the invention, the recess preferably comprises at least one groove which runs along, and at a certain distance from, at least one part of the periphery of the platform. According to the invention, the recess may advantageously comprise at least two grooves located beside one another and a certain distance apart, which run along, and at a certain distance from, at least one part of the periphery of the platform, at least one connecting groove emerging, on one side, in the outer groove and, on the other side, in the perforation.

According to the invention, the peripheral part of the leadframe preferably has, in its part held between the two parts of the mold, at least one escape recess which lies at a certain distance from the perforation and is located at a certain distance from the region where the encapsulation material is injected, and at least one connecting groove whose ends emerge, on one side, in the escape recess and, on the other side, in the perforation.

According to the invention, the escape recess may advantageously pass through the peripheral part. According to the invention, the peripheral part may advantageously have an elongate injection aperture located at a certain distance from and running along part of the periphery of the perforation and a connecting recess emerging, on one side, in this injection aperture and, on the other side, in the perforation and constituting a slot for injecting the injection material into this perforation between at least two of the leads. According to the invention, the connecting groove and the connecting recess are preferably on opposite sides with respect to the platform.

The subject of the present invention is also a semiconductor package body comprising a flat leadframe made of an electrically conducting material having a front face and a rear face and forming a central platform, and elongate electrical connection leads distributed around this platform and having an inner end located on the chip side and an outer end, together with means for encapsulating an integrated circuit chip fixed on the front face of the platform and electrical connection means connecting the chip to the leads, the encapsulation means being such that the rear face of the leadframe is visible. According to the invention, the platform preferably has, on its rear face, at least one recess which runs along and at a certain distance from at least one part of its periphery.

According to the invention, the platform preferably has, on its rear face, at least one connecting groove which lies between the recess and the periphery of this platform, the ends of this connecting groove emerging, on one side, in the main groove and, on the other side, laterally in the platform. According to the invention, the platform preferably has, on its rear face, at least one hollow which emerges laterally in the platform, the connecting groove emerging in this hollow.

According to the invention, the recess preferably comprises at least two grooves which are located beside one another and a certain distance apart, which run along and at a certain distance from at least one part of the periphery of the platform, at least one connecting groove emerging, on one side, in the outer groove and, on the other side, in the perforation. According to the invention, the encapsulation means preferably comprise an encapsulating material which lies, starting from the rear face of the leadframe, at least between the leads and between these leads and the platform. According to the invention, the encapsulating material may advantageously form, in front of the leadframe, a projecting ring through which the leads pass at a certain distance from their inner and outer ends.

BRIEF DESCRIPTION OF THE DRAWINGS

The present invention will be more clearly understood on studying the semiconductor packages described by way of non-limiting examples and illustrated by the drawing in which.

DETAILED DESCRIPTION OF THE PREFERRED EMBODIMENTS

FIGS. 1 to 5 show a flat metal leadframe which has various approximately square regions 2a–2i which are adjacent to one another and correspond to the locations of a package body to be produced. The structure of the leadframe 1 in each of the regions 2i will now be described. The leadframe 1 has a main perforation 3 which makes it possible to form, between a square central platform 4 and a peripheral part 5 located a certain distance from the platform 4 and having a square geometrical perimeter corresponding to that of the platform 4, a multiplicity of radiating leads, including connecting leads that connect the corners of the platform 4 at 45° to the peripheral part 5 and a multiplicity of cantilevered leads 7 which have an outer end connected to the peripheral part 5 and an inner end located a short distance from the edges of the platform 4.

Figure 2:
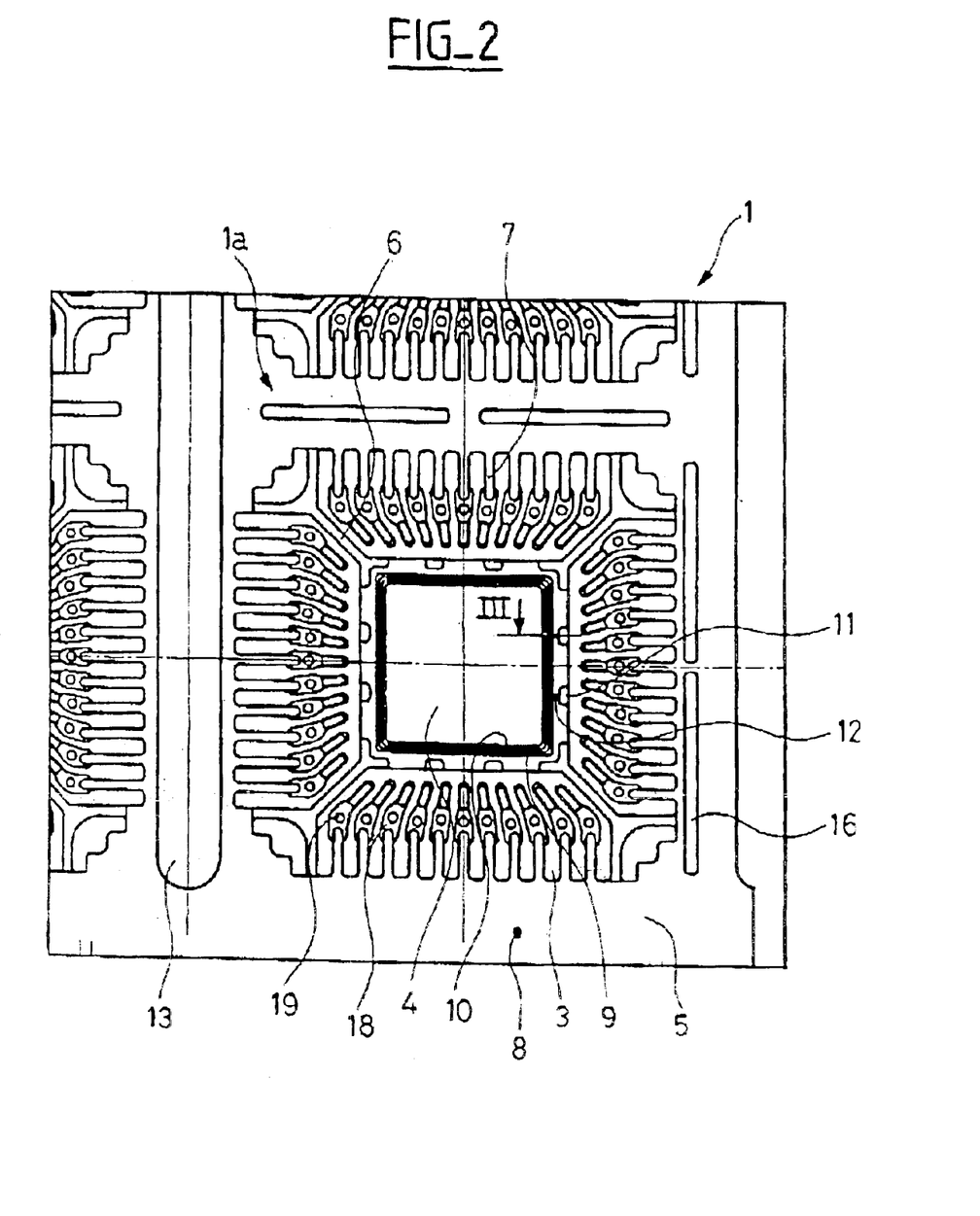
FIG. 2 is a diagram showing a rear view of the leadframe of FIG. 1.
Figure 3:
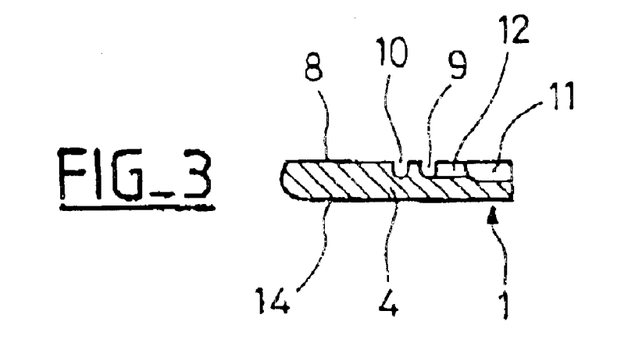
FIG. 3 is a diagram showing cross-sectional detail on III—III of the leadframe shown in FIG. 2.

As FIGS. 2 and 3 show in greater detail, the platform 4 has, on the rear face 8 of the leadframe 1, a recess formed from an outer groove 9 and from an inner groove 10, which are located a short distance apart and which extend in an annular and concentric fashion along the perimeter of the platform 4, a multiplicity of distributed hollows 11 which emerge in the perforation 3, and narrow connecting grooves 12 which emerge, on one side, in the outer groove 9 and, on the other side, in some of the hollows 11. The peripheral part 5 of the leadframe 1 has an elongate injection aperture or perforation 13 provided along and a certain distance from one geometrical side of the main perforation 3.

Figure 1:
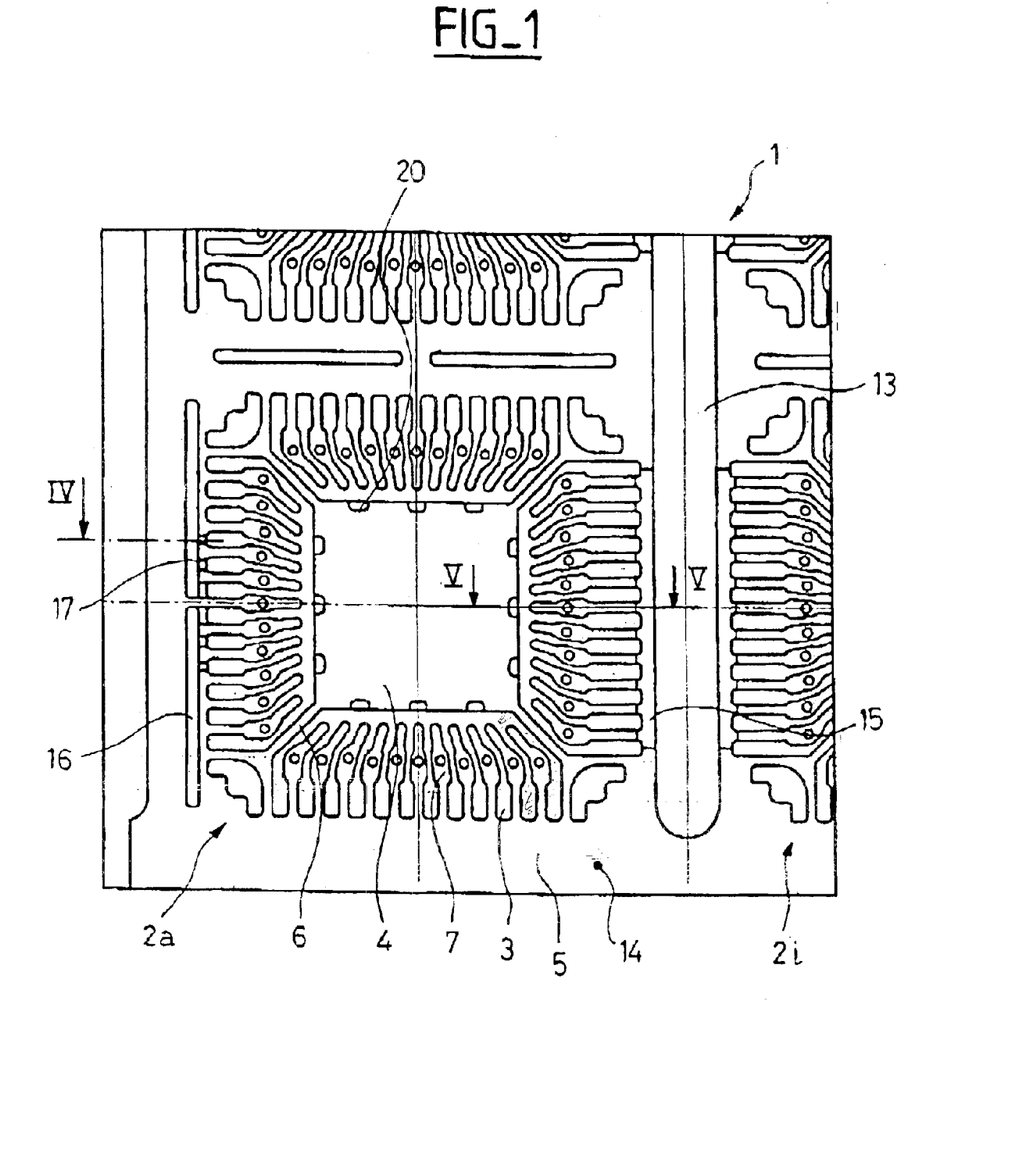
FIG. 1 is a diagram showing a front view of a leadframe for the subsequent production of at least one semiconductor package.
Figure 4:
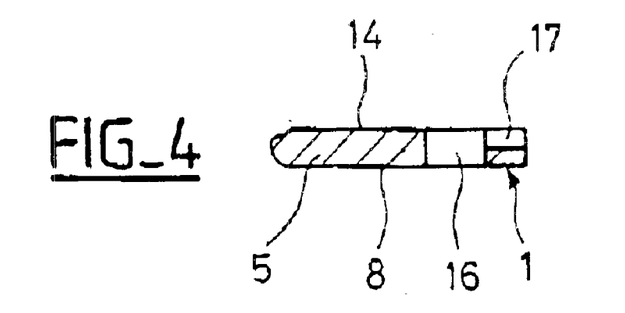
FIG. 4 is a diagram showing cross-sectional detail on IV—IV of the leadframe shown in FIG. 1.
Figure 5:
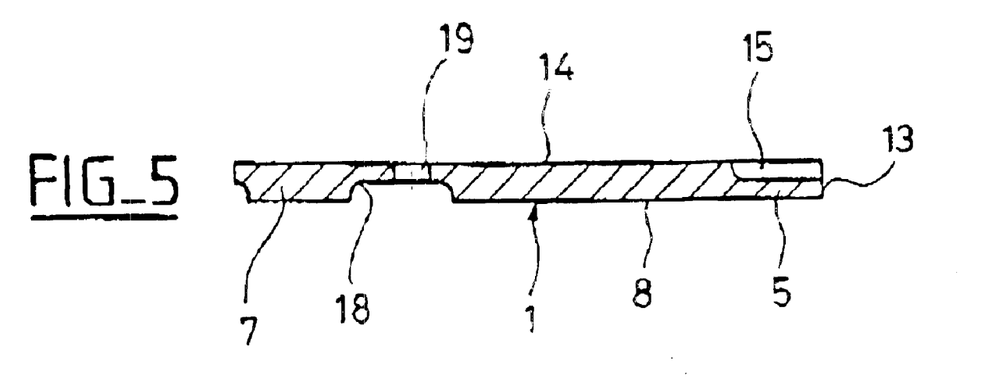
FIG. 5 is a diagram showing cross-sectional detail on V—V of the leadframe shown in FIG. 1.

As FIGS. 1 and 5 show in greater detail, the peripheral part 5 has, on the front face 14 of the leadframe 1, an elongate recess 15 whose sides emerge, on the one hand, in the injection perforation 13 and, on the other hand, between the leads 7 that are adjacent to it. As FIGS. 1 and 4 show, the peripheral part 5 of the leadframe 1 has, on the opposite side to the injection perforation 13, an elongate escape perforation 16 which lies along the opposite geometrical edge of the perforation 3, this perforation 16 being divided into two parts. The peripheral part 5 furthermore has, in the front face 14 of the leadframe 1, narrow connecting grooves 17 which emerge, on one side, in the escape perforation 16 and, on the other side, between some of the leads 7 that are adjacent to it.

The leads 7 have, in the rear face 8 of the leadframe 1, recesses 18 which extend over part of their length and which emerge laterally and through-holes 19 provided approximately in the middle of these recesses 18. The platform 4 has, in the front face 14 of the leadframe 1, hollows 20 which emerge in the main perforation 3 and which are produced so as to be offset with respect to the hollows 11 provided on the rear face 8 of the leadframe 1.

Figure 6:
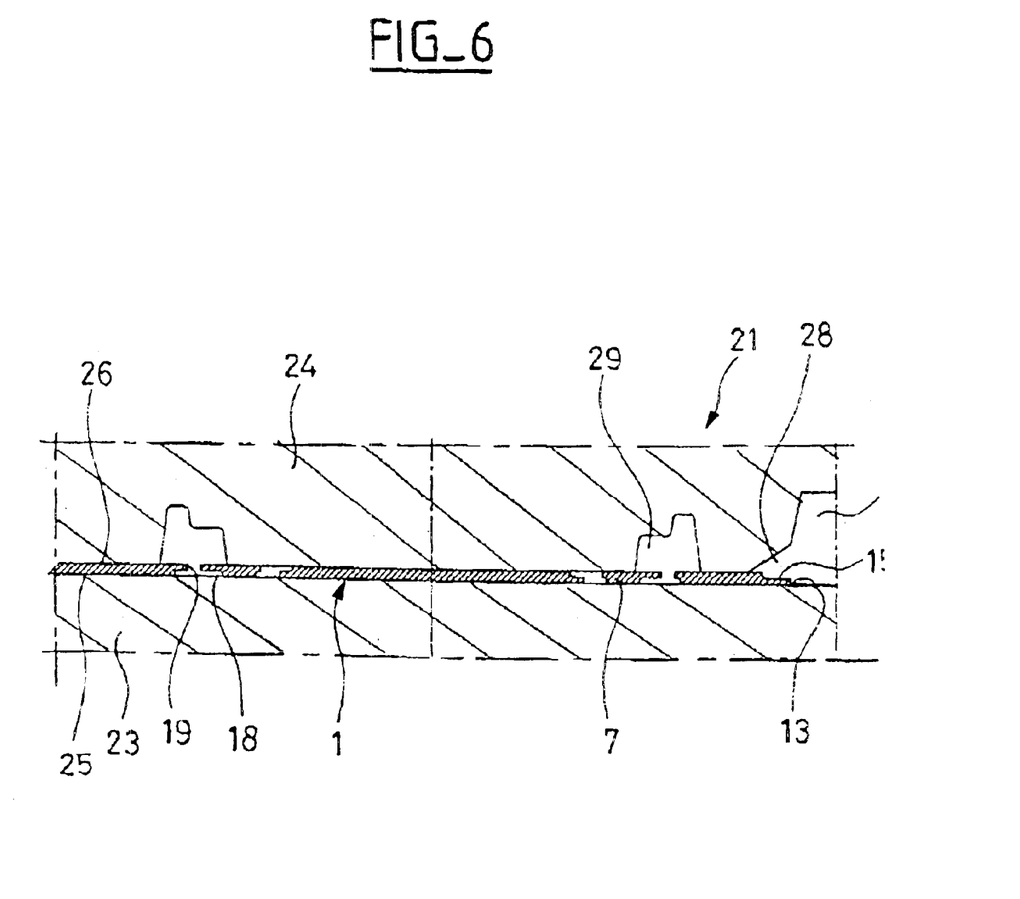
FIG. 6 is a diagram showing a cross-section of a mold for injection-moulding an encapsulation material in which the aforementioned leadframe is placed.
Figure 7:
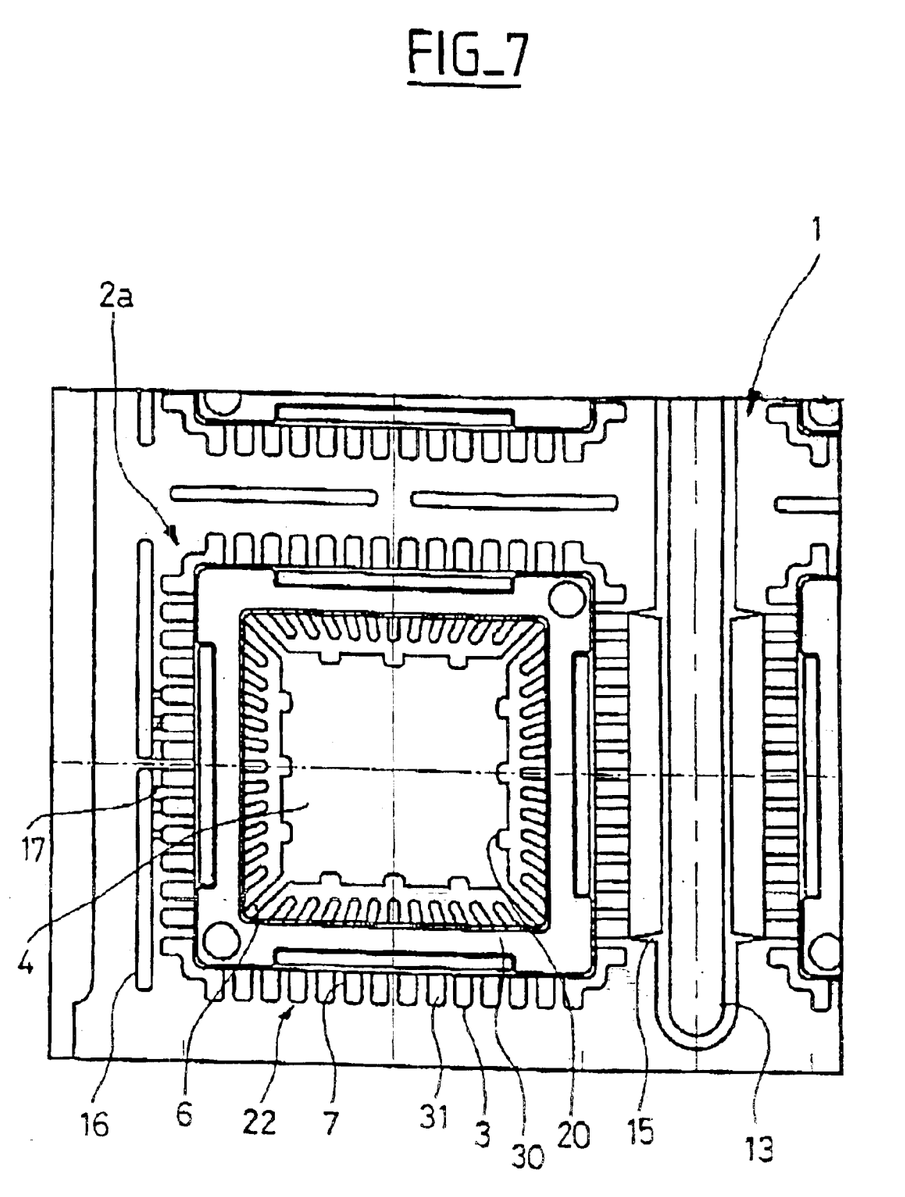
FIG. 7 is a diagram showing a top view of a package body obtained from the injection-molding mold of FIG. 6.
Figure 8:
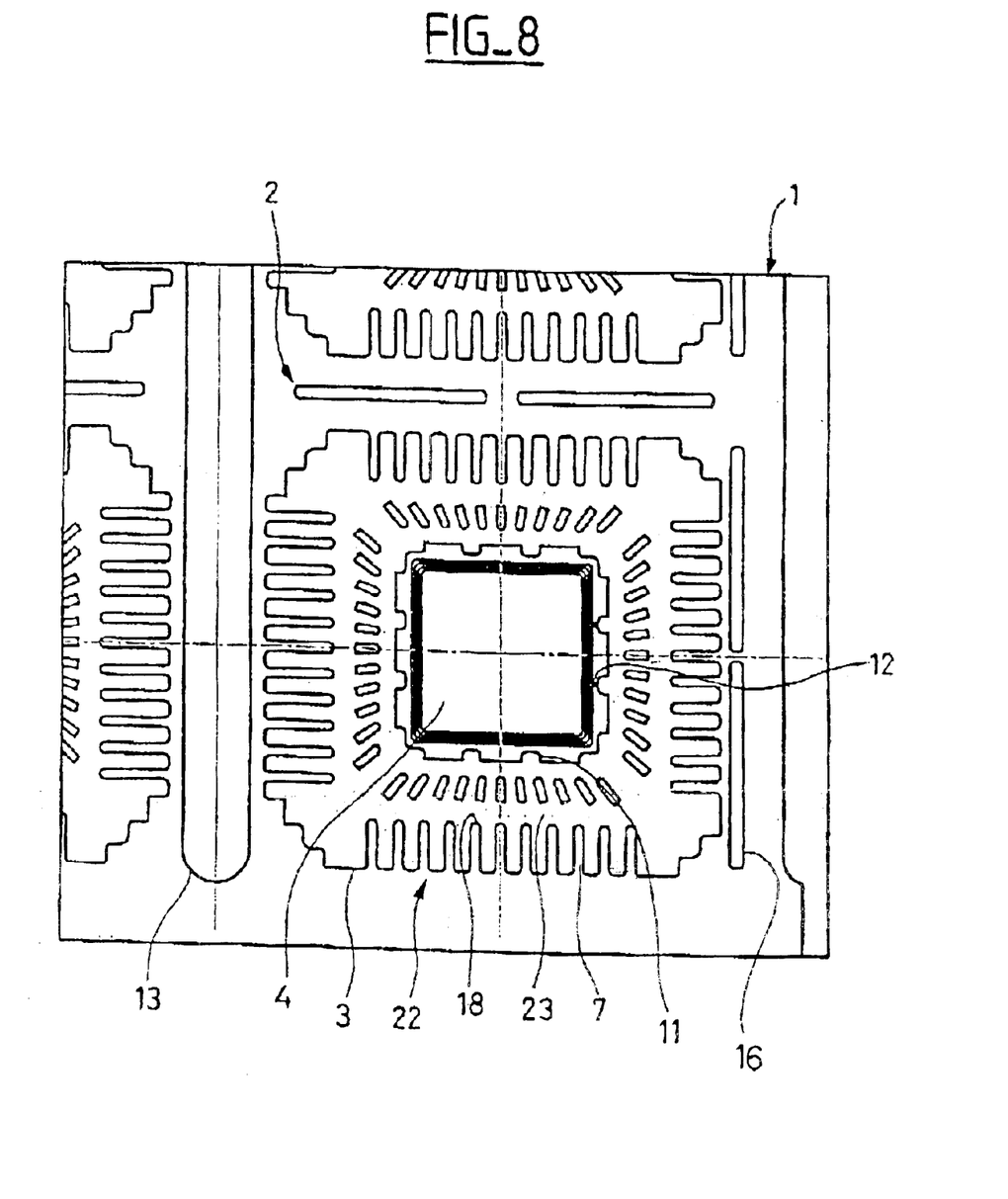
FIG. 8 is a diagram showing a bottom view of the package body of FIG. 7.

FIG. 6 shows an injection-molding mold 21 in which the leadframe 1 can be placed so as to produce a package body 22 as shown in FIGS. 7 and 8 in correspondence with each region 2i of the leadframe 1. The mold 21 comprises a lower part 23 and an upper part 24 which have flat bearing faces 25 and 26 between which the leadframe 1 may be held in such a way that its rear face 8 is in contact with the bearing face 25 of the lower part 23 and its front face 14 is in contact with the bearing face 26 of the upper part 24. The upper part 24 of the mold 21 has an injection recess 27 which lies along the injection perforation 13 of the leadframe 1, extending on one side slightly beyond its elongate recess 15 so as to form an elongate injection slot 28.

The part 24 of the mold 21 also has an annular cavity 29 forming a square, which lies above the median part of the connecting leads 6 and of the cantilevered leads 7 so that these leads pass through it, at a certain distance from their inner and outer ends, the through-holes 19 being approximately in the middle of this cavity 29 with respect to its transverse direction. Thus, the central platform 4 and the inner end parts of the leads 7 are held between the parts 23 and 24 of the mold 21, on the inside of its cavity 29, and the peripheral part 5 and the outer parts of the leads 6 and 7 are held between the parts 23 and 24 of the mold 21, outside its cavity 29, the connecting leads 7 passing through the space separating the parts 23 and 24 of the mold 21. It also follows that the main perforation 13 of the leadframe 1 defines a cavity between the bearing faces 25 and 26 of the parts 23 and 24 of the mold 21.

When an encapsulation material, for example a thermosetting resin, is being injected into the injection cavity 27 and the injection perforation 15, this material penetrates the cavity defined by the main perforation 3 through the elongate slot 28, right along one side of this perforation 3, passing between the corresponding leads. As the material advances, it fills, between the faces 25 and 26 of the mold parts 23 and 24, the spaces between the leads 6 and 7 and the spaces between the ends of the leads 7 and the platform 4, fills the rear and front hollows 11 and 20 of the platform 4, fills the rear recesses 18 and the holes 19 in the leads 7 and fills the annular cavity 29.

In this way, the gases can escape from the cavity formed by the main perforation 3 via the thin connecting grooves 12 towards the peripheral rear groove 9 in the platform 4 and can possibly leak away towards the inner annular groove 10 in this platform in such a way that the region surrounding the platform can be appropriately filled. Furthermore, the gases can escape from the cavity produced by the main perforation 3 towards the escape perforation 16 through the thin connecting grooves 17 which are located on the opposite side of the injection region, formed by the slot 28. Thus, the peripheral regions of the cavity, formed by the main perforation 3, may also be appropriately filled with the injected material.

As FIGS. 7 and 8 show, the package body 22 obtained in a region 2i of the leadframe 1, after demolding, comprises a projecting ring 30 of material corresponding to the cavity 29 of the mold 21 and a filling 31 of material in the thickness of the leadframe 1 between the leads 6 and 7 and the platform 4, in the hollows 11 and 20 and in the recesses 18 and the holes 19 connecting these recesses to the ring 30.

Figure 9:
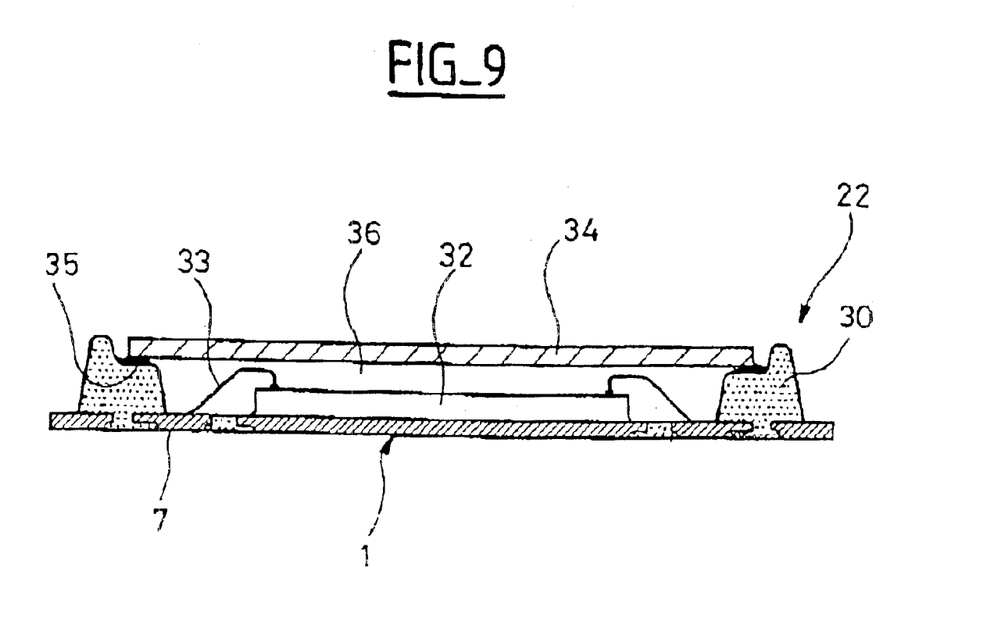
FIG. 9 is a diagram showing a cross-section of a semiconductor package which includes the package body of FIGS. 7 and 8.

As shown in FIG. 9, the following operations are then carried out, for each region 2i of the leadframe 1: an integrated circuit chip 32 is fixed to the front face of the platform 4 via a layer of adhesive; the ends of electrical connection wires 33 are connected, by bonding, to the front face of the inner parts of the leads 7 and to front pads on the chip 32; and the peripheral part of a window 34 is fixed to the ring 30 via a layer of adhesive 35; this forms a closed and sealed space 36 in which the chip 32 and the electrical connection wires 33 are encapsulated. Thereafter, the leadframe 4 may be cut around the ring 30, for example by sawing, sectioning the leads 6 and 7, so as to obtain the semiconductor package 22 as shown in FIG. 9.

That which is claimed is:

1. An electrically conductive leadframe for a semiconductor package, the leadframe having a front face end a rear face, and the leadframe being holdable, between two parts of a mold for the injection molding of an encapsulation material which delimits at least one cavity, in a position such that the rear face is in contact with a bearing surface of part of the mold, the leadframe comprising:
   a central platform;
   a peripheral part adjacent the central platform;
   at least one perforation defining, between the central platform and the peripheral part, first radiating elongate leads having outer and inner ends connected to the peripheral part and to the platform, respectively, and second radiating elongate leads having outer ends connected to the peripheral part and inner ends positioned a certain distance from the platform; and
   at least one recess formed in the platform on the rear face that comes into contact with the bearing surface of the mold, and at a certain distance from a periphery of the platform.

2. The leadframe according to claim 1, wherein the platform includes at least one connecting groove on the rear face and having a first end emerging in the recess and a second end emerging in the perforation.

3. The leadframe according to claim 2, wherein the platform includes at least one hollow that opens into the perforation, the second end of the connecting groove emerging in the hollow.

4. The leadframe according to claim 1, wherein the recess comprises at least one groove which runs along, and at a certain distance from, at least a portion of the periphery of the platform.

5. The leadframe according to claim 1, wherein the recess comprises at least two grooves adjacent one another, which run along, and at a certain distance from, at least a portion of the periphery of the platform; wherein the platform includes at least one connecting groove on the rear face and having a first end emerging in the recess and a second end emerging in the perforation.

6. An electrically conductive leadframe for a semiconductor package, the leadframe having a front face and a rear face, and the leadframe being holdable, between two parts of a mold for the injection molding of an encapsulation material which delimits at least one cavity, in a position such that the rear face is in contact with a bearing surface of part of the mold, the leadframe comprising:
   a central platform;
   a peripheral part adjacent the central platform;
   at least one perforation defining, between the central platform and the peripheral part, first radiating elongate leads having outer and inner ends connected to the peripheral part and to the platform, respectively, and second radiating elongate leads having outer ends connected to the peripheral part and inner ends positioned a certain distance from the platform;
   at least one encapsulation material escape recess in the peripheral part at a certain distance from the perforation; and
   at least one connecting groove having a first end emerging in the escape recess and a second end emerging in the perforation.

7. The leadframe according to claim 6, wherein the escape recess extends through the peripheral part.

8. The leadframe according to claim 6, wherein the peripheral part includes:
   an elongate injection aperture located at a certain distance from and running along a portion of a periphery of the perforation; and
   a connecting recess extending from the injection aperture to the perforation and defining an injection slot for injecting the injection material into the perforation between at least two of the leads.

9. The leadframe according to claim 8, wherein the connecting groove and the connecting recess are on opposite faces of the leadframe.

10. An electrically conductive leadframe for a semiconductor package, the leadframe comprising:
    a central platform;
    a peripheral part adjacent the central platform;
    at least one perforation defining, between the central platform and the peripheral part, radiating elongate leads having outer ends connected to the peripheral part and inner ends extending towards the platform; and
    at least one recess in a surface of the platform and adjacent a periphery of the platform.

11. The leadframe according to claim 10, wherein the platform includes at least one connecting groove on the surface and extending between the recess and the perforation.

12. The leadframe according to claim 11, wherein the platform includes at least one peripheral hollow that opens into the perforation, the connecting groove extending to the hollow.

13. The leadframe according to claim 10, wherein the recess comprises at least one groove adjacent the periphery of the platform.

14. The leadframe according to claim 10, wherein the recess comprises at least two grooves adjacent the periphery of the platform; wherein the platform includes at least one connecting groove on the surface and extending between the recess and the perforation.

15. An electrically conductive leadframe for a semiconductor package, the leadframe comprising:
    a central platform;
    a peripheral part adjacent the central platform;
    at least one perforation defining, between the central platform and the peripheral part, radiating elongate leads having outer ends connected to the peripheral part and inner ends extending towards the platform;
    at least one encapsulation material escape recess in the peripheral part adjacent the perforations; and
    at least one connecting groove extending between the escape recess and the perforation.

16. The leadframe according to claim 15, wherein the escape recess extends through the peripheral part.

17. The leadframe according to claim 15, wherein the peripheral part includes:
    an elongate injection aperture adjacent a periphery of the perforation; and
    a connecting recess extending from the injection aperture to the perforation and defining an injection slot for injecting the injection material into the perforation between at least two of the leads.

18. The leadframe according to claim 17, wherein the connecting groove and the connecting recess are on opposite faces of the leadframe.

19. A semiconductor package body comprising:

an electrically conductive leadframe including a central platform and radiating elongate leads having inner ends extending towards the platform;

an integrated circuit chip fixed on a front face of the platform;

an encapsulating material encapsulating the integrated circuit chip while leaving a rear face of the leadframe visible;

electrical connections connecting the chip to the leads; and at least one recess in the platform on the rear face and extending along at least a portion of a periphery of the platform.

20. The semiconductor package body according to claim 19, wherein the platform includes at least one connecting groove on the rear face and extending between the recess and the periphery of the platform.

21. The semiconductor package body according to claim 20, wherein the platform includes at least one hollow in the periphery of the platform, the connecting groove extending in this hollow.

22. The semiconductor package body according to claim 19, wherein the recess comprises at least two grooves adjacent a portion of the periphery of the platform; wherein the platform includes at least one connecting groove on the rear face and extending between one of the grooves and the periphery of the platform.

23. The semiconductor package body according to claim 19, wherein the encapsulation material extends from the rear face of the leadframe between the leads and between the leads and the platform.

24. The semiconductor package body according to claim 23, wherein the encapsulating material comprises a projecting ring on front face of the leadframe, the leads passing through the projecting ring.

* * * * *

UNITED STATES PATENT AND TRADEMARK OFFICE
CERTIFICATE OF CORRECTION

PATENT NO.        : 6,885,088 B2                                                Page 1 of 1
APPLICATION NO. : 10/371397
DATED             : April 26, 2005
INVENTOR(S)       : Diot et al.

It is certified that error appears in the above-identified patent and that said Letters Patent is hereby corrected as shown below:

In the Drawings    Delete: FIG. 6
                   Insert: New FIG. 6 as shown below
--

Column 5, Line 7    Delete: "end"
                    Insert: --and--

Column 6, Line 51   Delete: "perforations"
                    Insert: -- perforation--

Column 8, Line 16   Delete: "on front"
                    Insert: --on the front--

Signed and Sealed this

Nineteenth Day of June, 2007

JON W. DUDAS
*Director of the United States Patent and Trademark Office*